(12) United States Patent
Wu et al.

(10) Patent No.: US 10,332,787 B2
(45) Date of Patent: Jun. 25, 2019

(54) FORMATION METHOD OF INTERCONNECTION STRUCTURE OF SEMICONDUCTOR DEVICE

(71) Applicant: Taiwan Semiconductor Manufacturing Co., Ltd., Hsinchu (TW)

(72) Inventors: Chung-Wen Wu, Zhubei (TW); Chien-Wen Chiu, Tainan (TW); Chien-Chung Chen, Kaohsiung (TW); Shiu-Ko Jangjian, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 60 days.

(21) Appl. No.: 15/633,992

(22) Filed: Jun. 27, 2017

(65) Prior Publication Data

US 2018/0374744 A1    Dec. 27, 2018

(51) Int. Cl.
*H01L 21/76*    (2006.01)
*H01L 21/768*    (2006.01)

(52) U.S. Cl.
CPC .. *H01L 21/76816* (2013.01); *H01L 21/76832* (2013.01); *H01L 21/76843* (2013.01); *H01L 21/76877* (2013.01)

(58) Field of Classification Search
CPC ......... H01L 21/76805; H01L 21/76831; H01L 21/76816; H01L 21/76807; H01L 2221/1015; H01L 2221/1031; H01L 2221/1036; H01L 2224/05006; H01L 2224/05546
See application file for complete search history.

(56) References Cited

U.S. PATENT DOCUMENTS

| 2004/0127001 | A1  | 7/2004  | Colburn et al. |
| 2006/0040498 | A1  | 2/2006  | Yang et al. |
| 2006/0189137 | A1* | 8/2006  | Anderson ......... H01L 21/31144 438/691 |
| 2007/0267751 | A1* | 11/2007 | Yang ..................... H01L 21/288 257/758 |
| 2008/0299718 | A1  | 12/2008 | Jiang et al. |

(Continued)

OTHER PUBLICATIONS

Chinese language office action dated Apr. 11, 2018, issued in application No. TW 106135674.

*Primary Examiner* — Moin M Rahman
(74) *Attorney, Agent, or Firm* — McClure, Qualey & Rodack, LLP

(57) ABSTRACT

Formation methods of a semiconductor device structure are provided. A method includes forming a dielectric layer over a first conductive feature and a second conductive feature. The method also includes depositing a conformal layer in a first via hole and a second via hole in the dielectric layer. The method further includes removing the conformal layer in the second via hole. The dielectric layer remains covered by the conformal layer in the first via hole. In addition, the method includes etching the conformal layer in the first via hole and the dielectric layer until the first conductive feature and the second conductive feature become exposed through the first via hole and the second via hole, respectively. The method also includes forming a third conductive feature in the first via hole and a fourth conductive feature in the second via hole.

20 Claims, 14 Drawing Sheets

(56) References Cited

U.S. PATENT DOCUMENTS

| | | | |
|---|---|---|---|
| 2013/0020712 A1* | 1/2013 | Aipperspach | H01L 23/5226 |
| | | | 257/773 |
| 2014/0035142 A1* | 2/2014 | Yang | H01L 23/528 |
| | | | 257/751 |
| 2015/0200133 A1* | 7/2015 | Chou | H01L 21/3105 |
| | | | 438/4 |
| 2016/0099174 A1* | 4/2016 | Wu | H01L 21/76808 |
| | | | 438/618 |
| 2016/0268207 A1* | 9/2016 | Naik | H01L 23/53238 |

* cited by examiner

FORMATION METHOD OF INTERCONNECTION STRUCTURE OF SEMICONDUCTOR DEVICE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
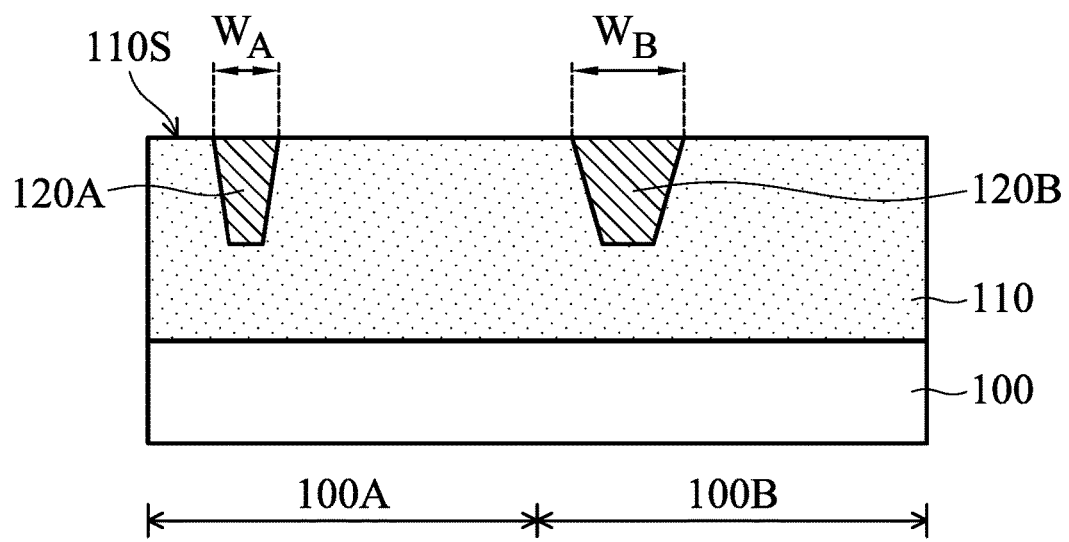
FIGS. 1A-1N are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
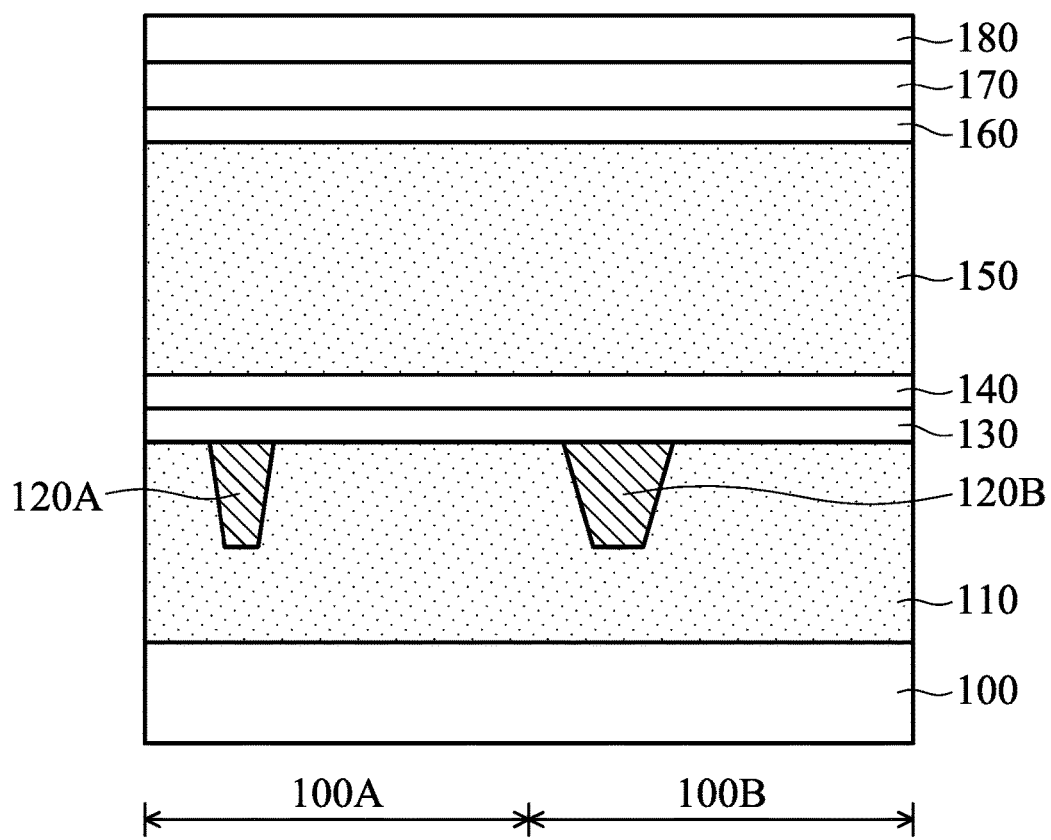
Figure 1C:
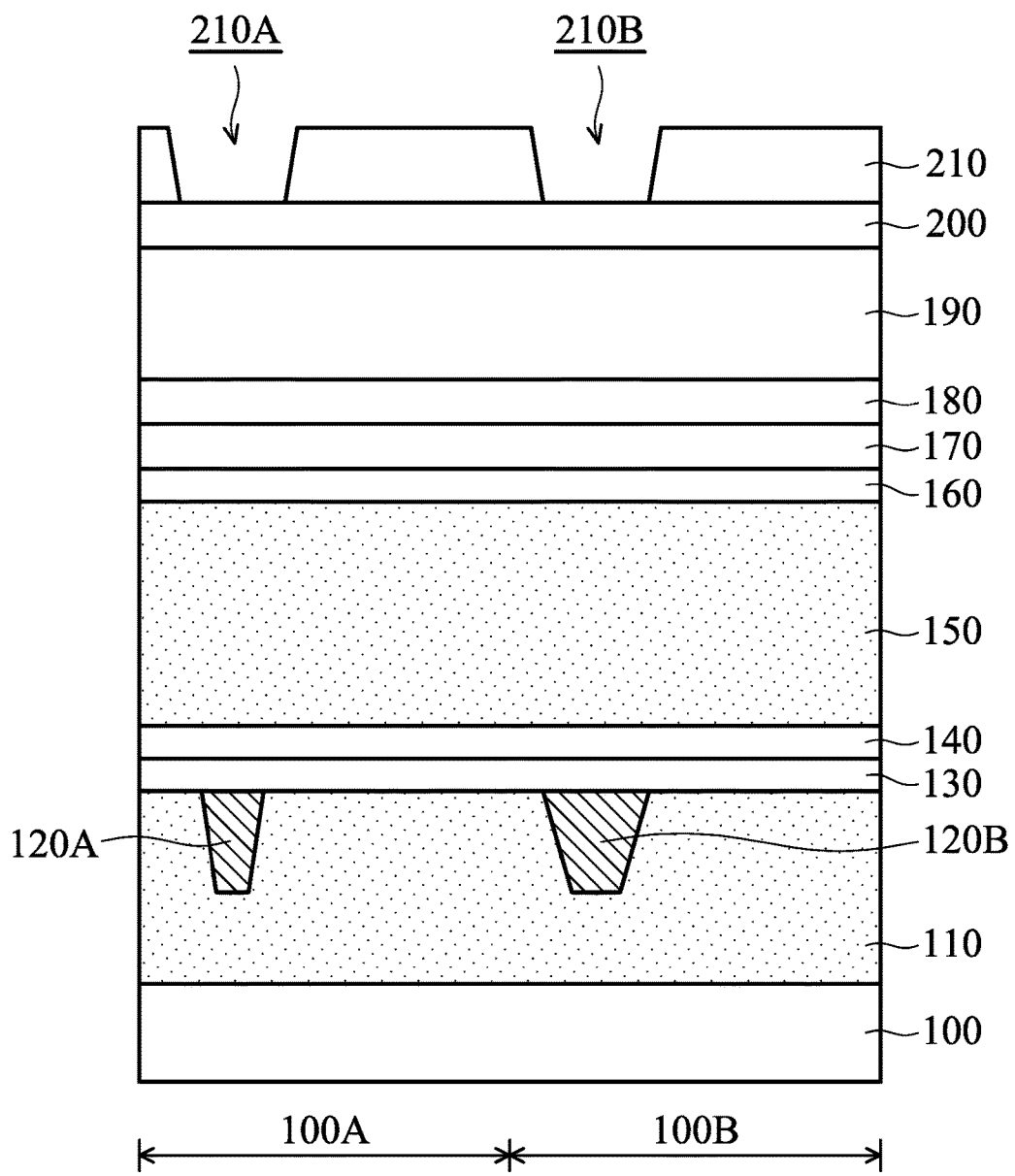
Figure 1D:
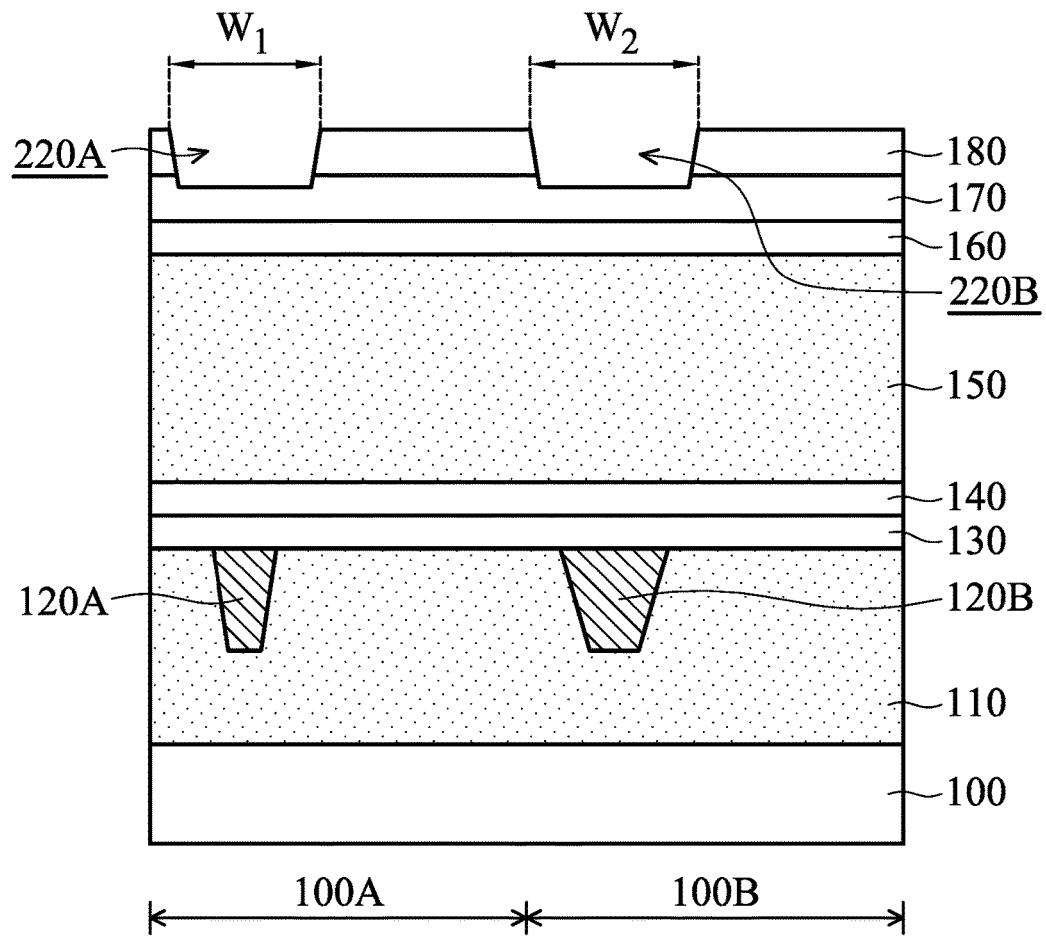
Figure 1E:
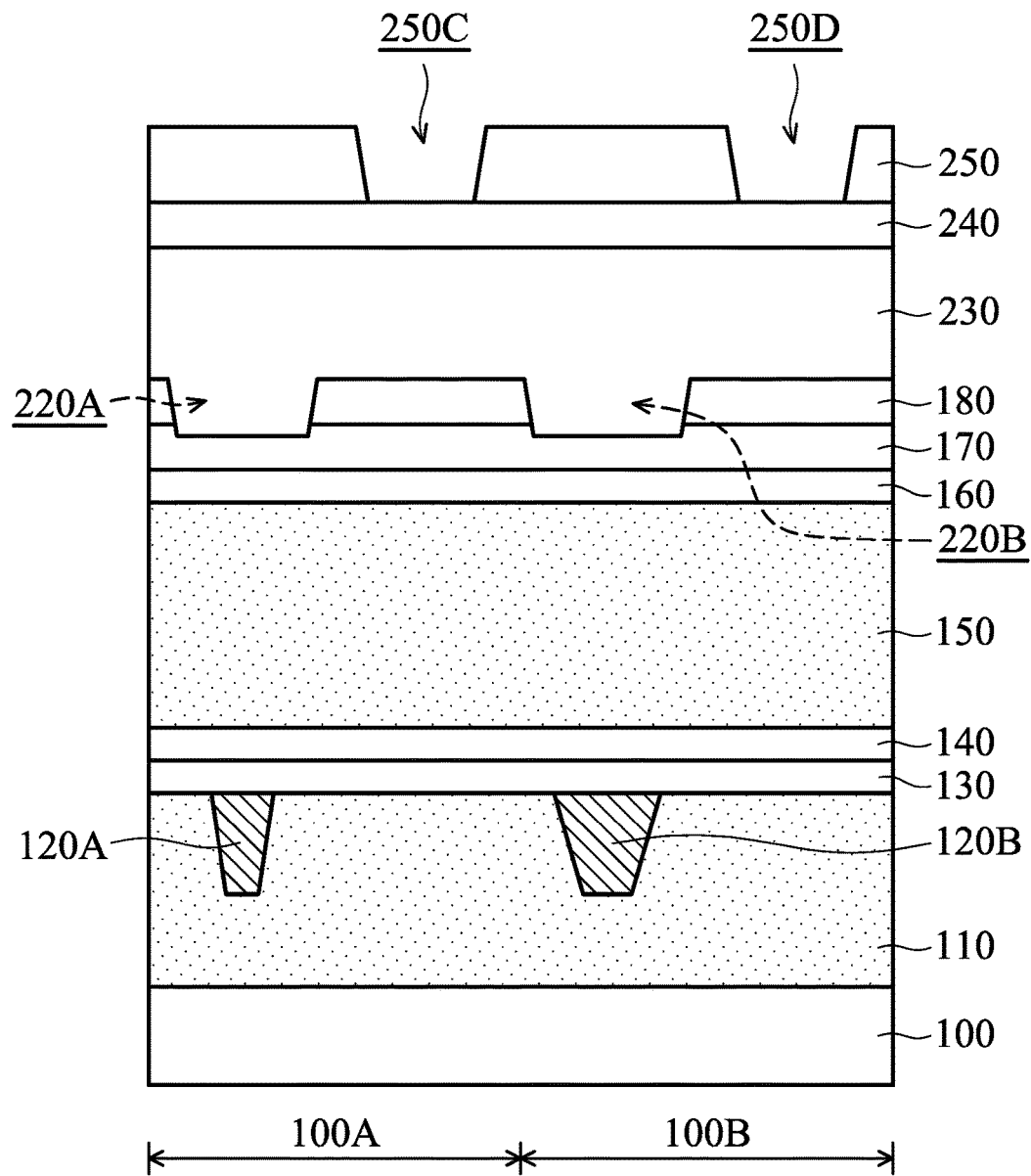
Figure 1F:
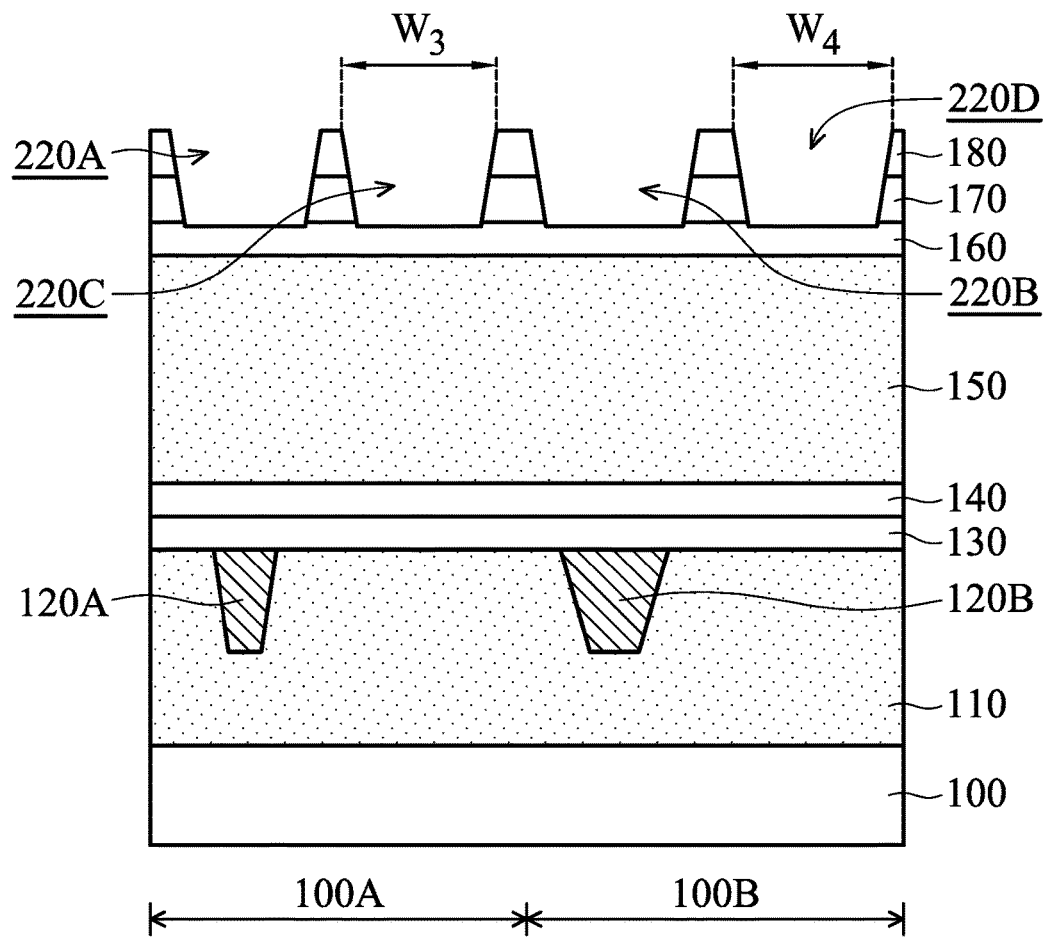
Figure 1G:
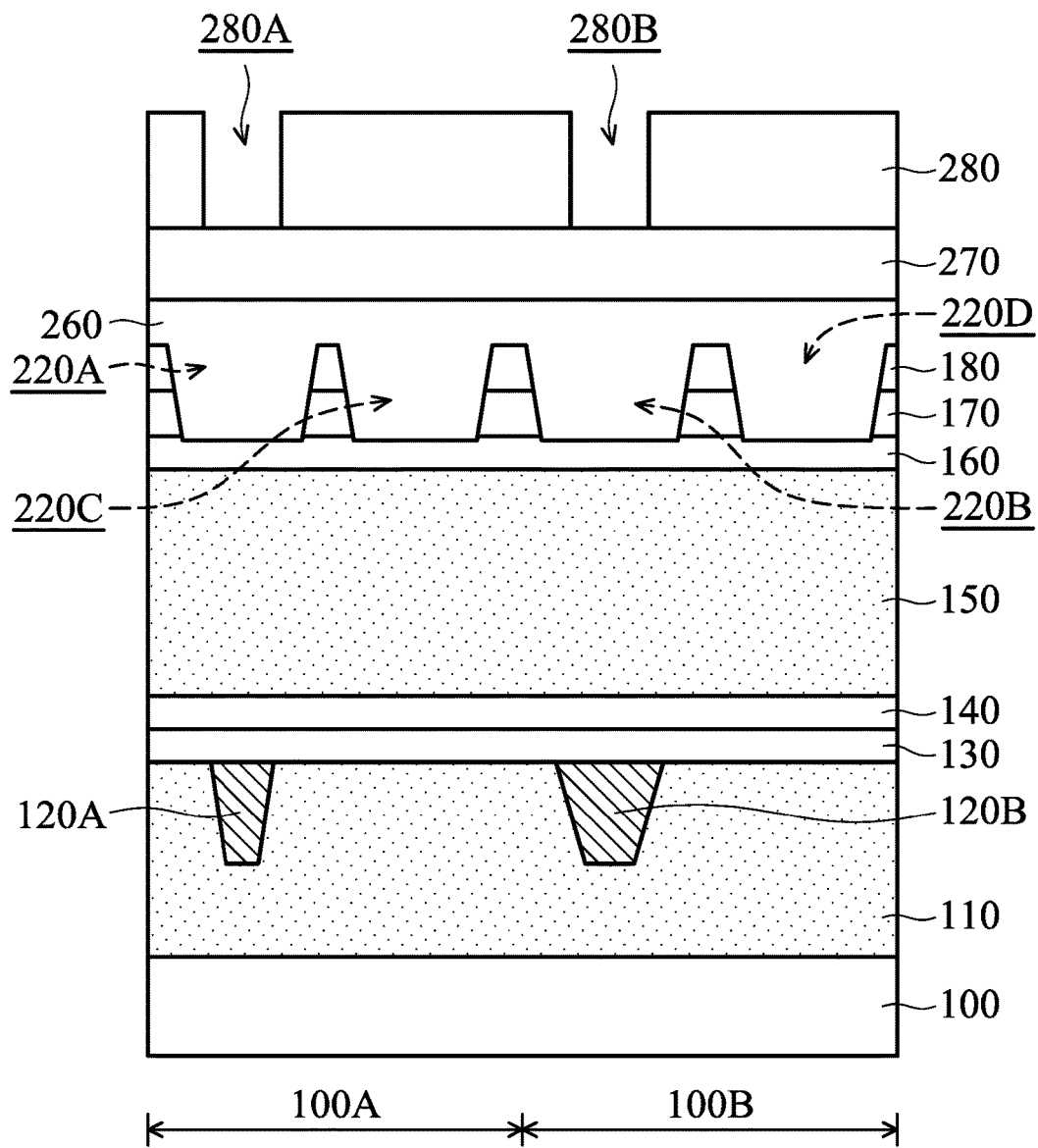
Figure 1H:
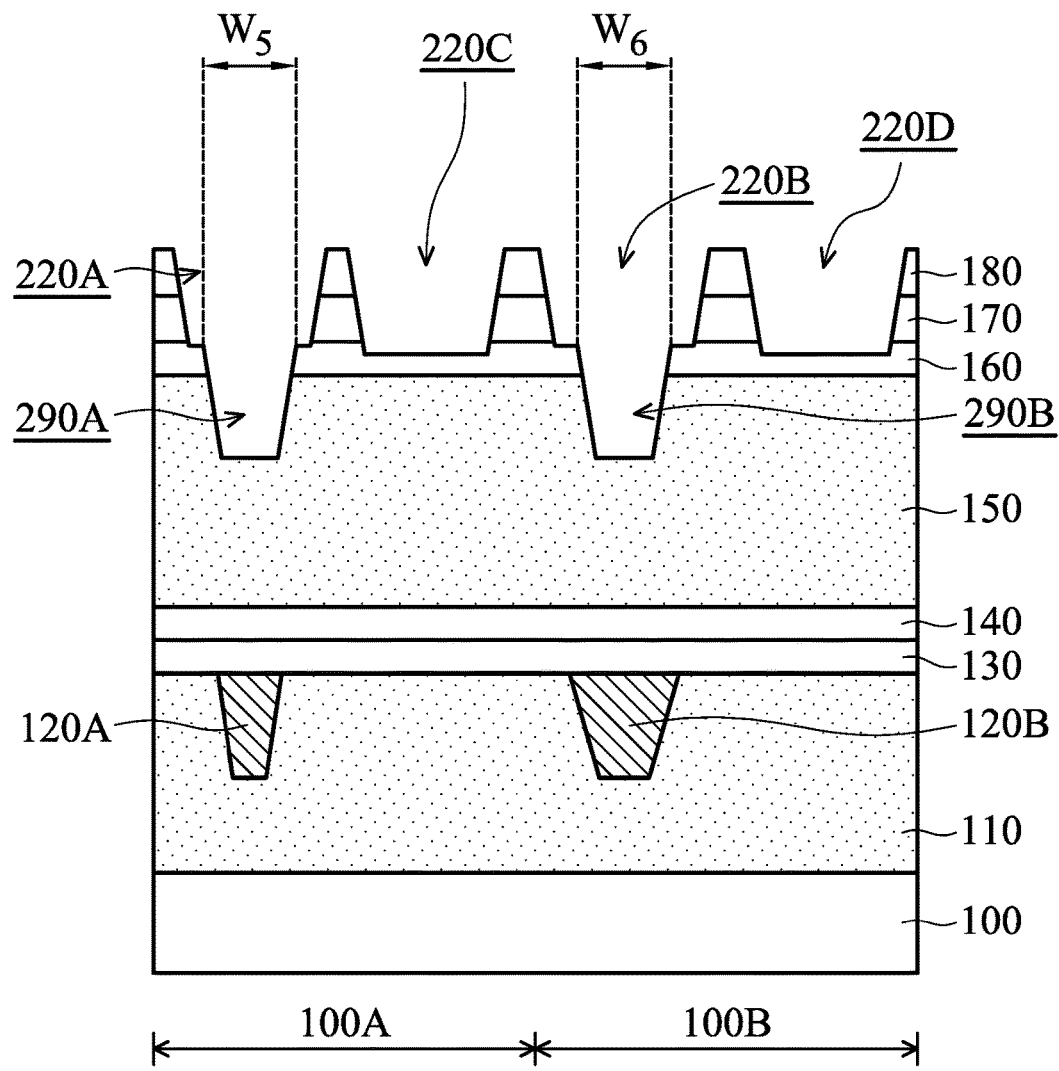
Figure 1I:
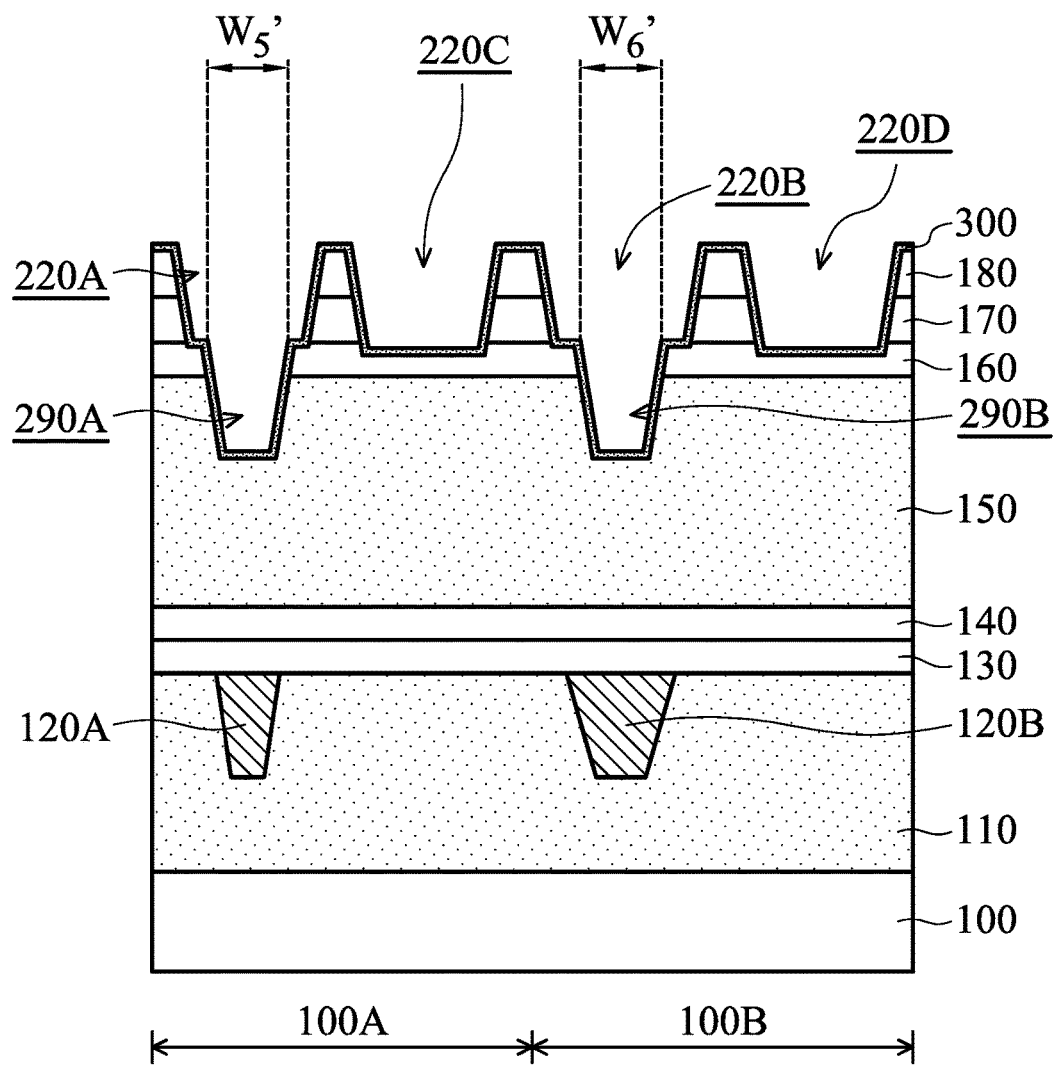
Figure 1J:
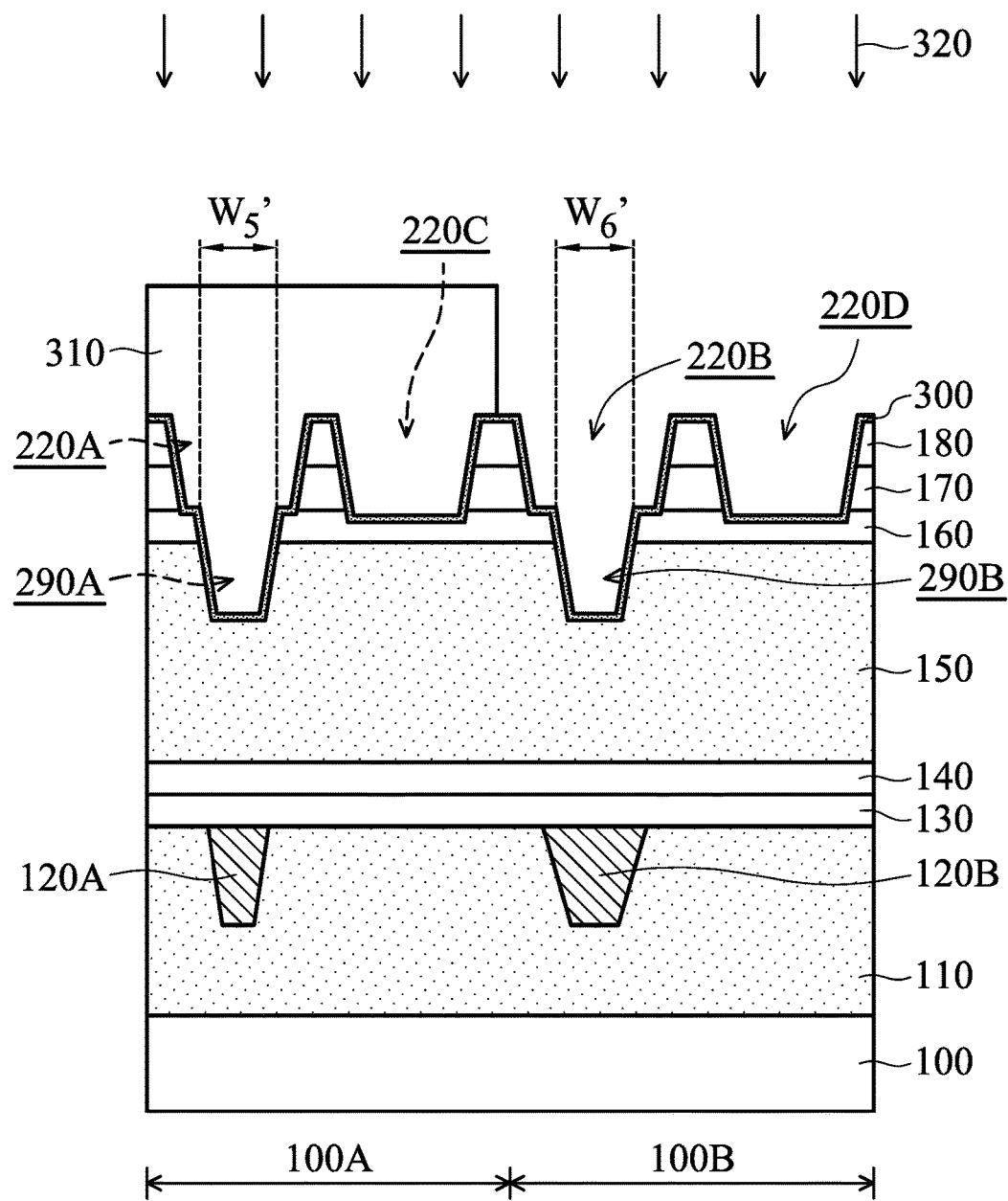
Figure 1K:
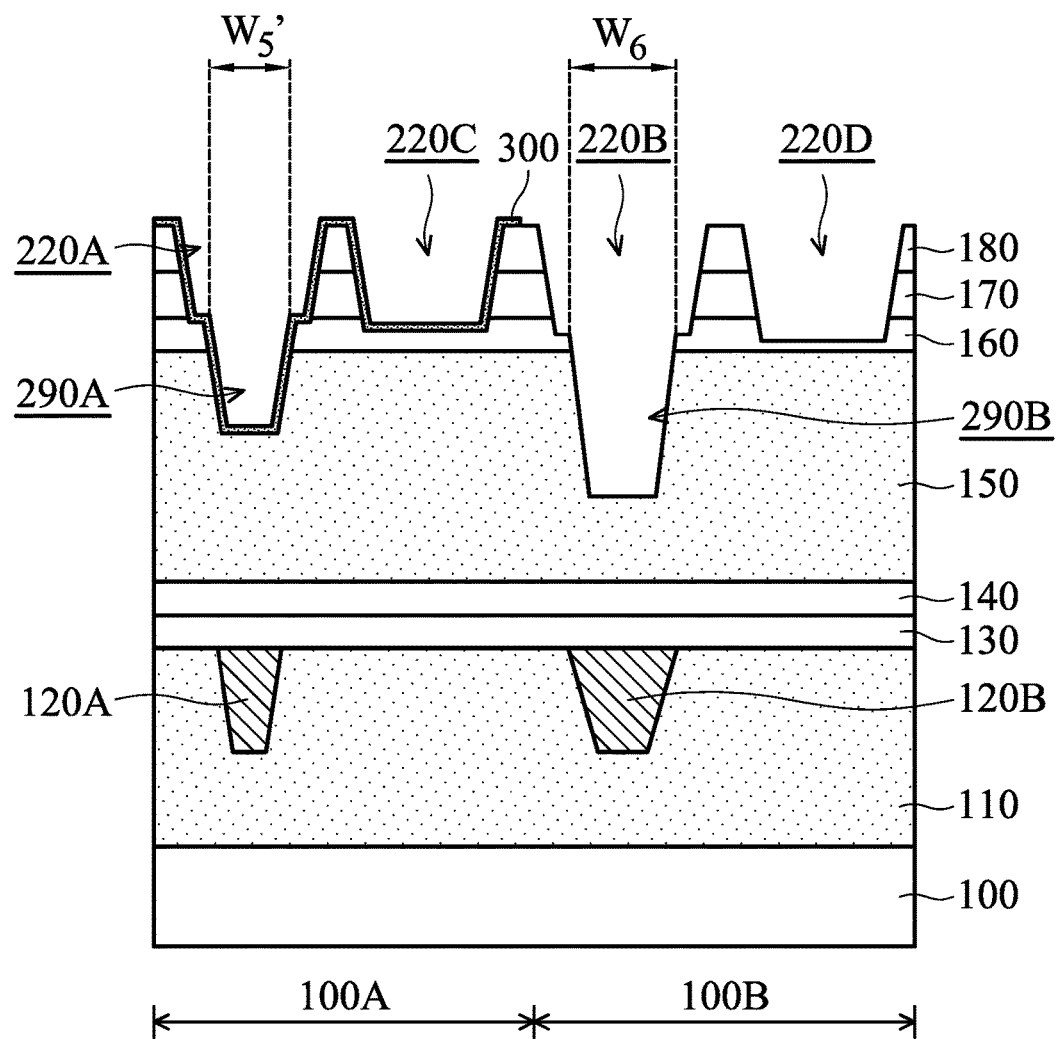
Figure 1L:
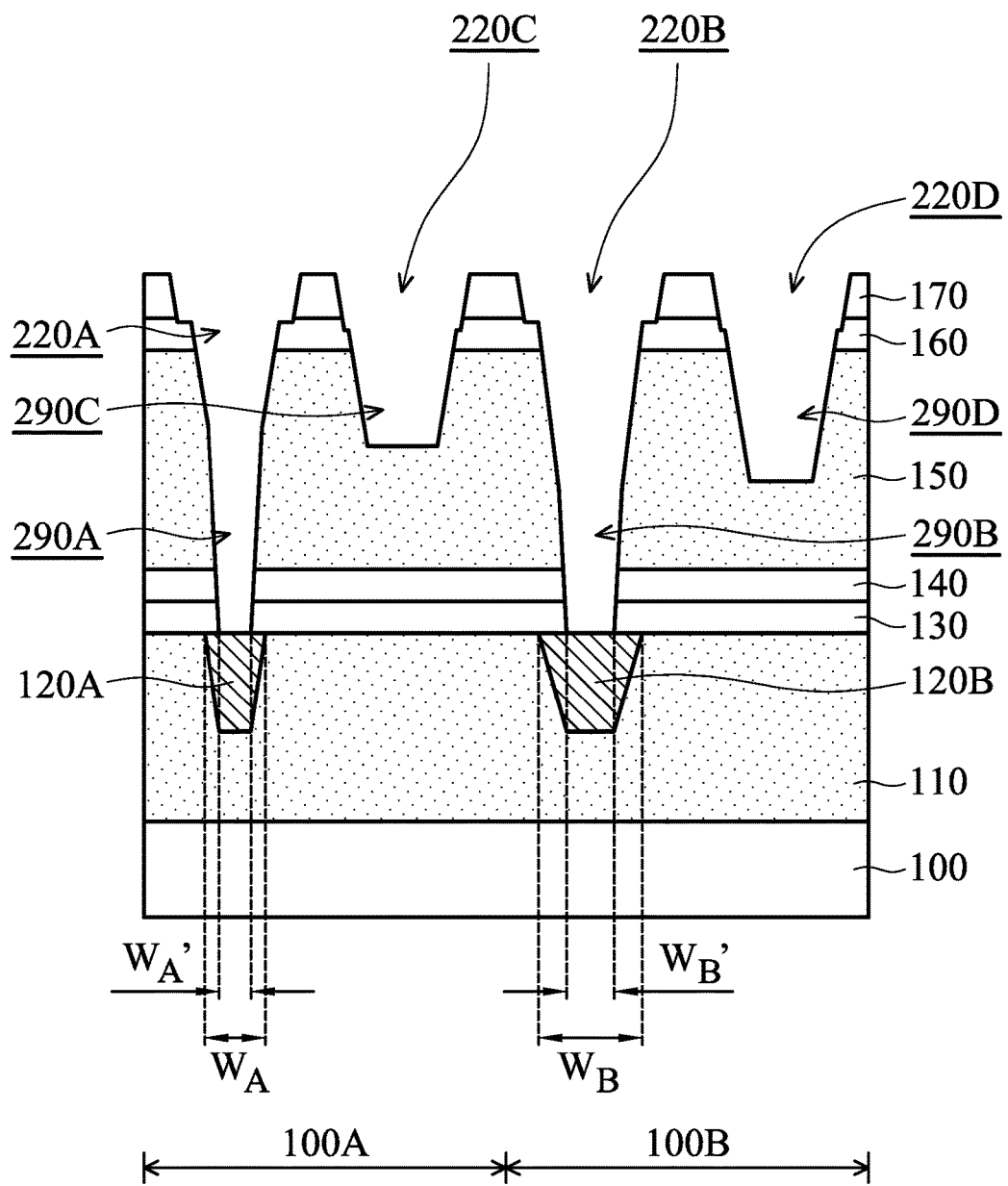
Figure 1M:
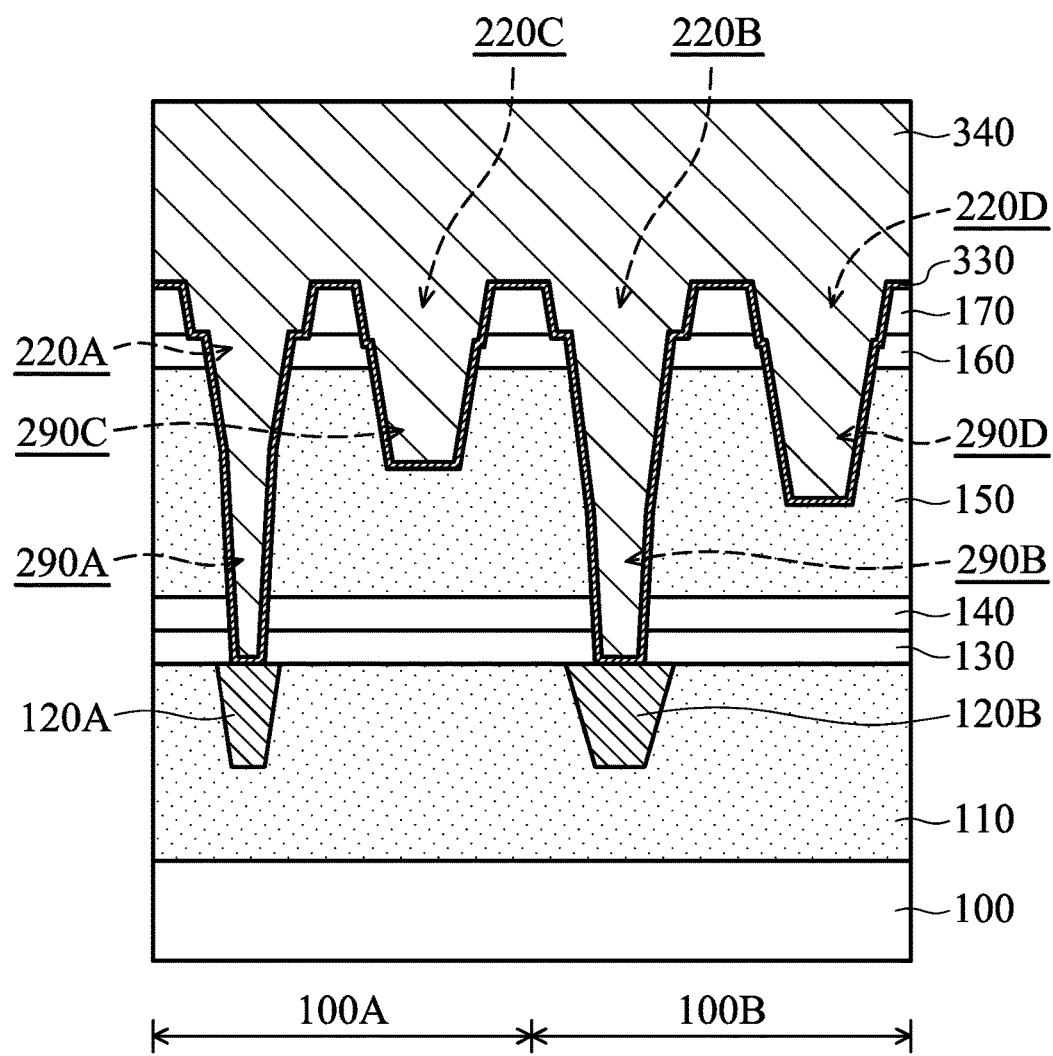
Figure 1N:
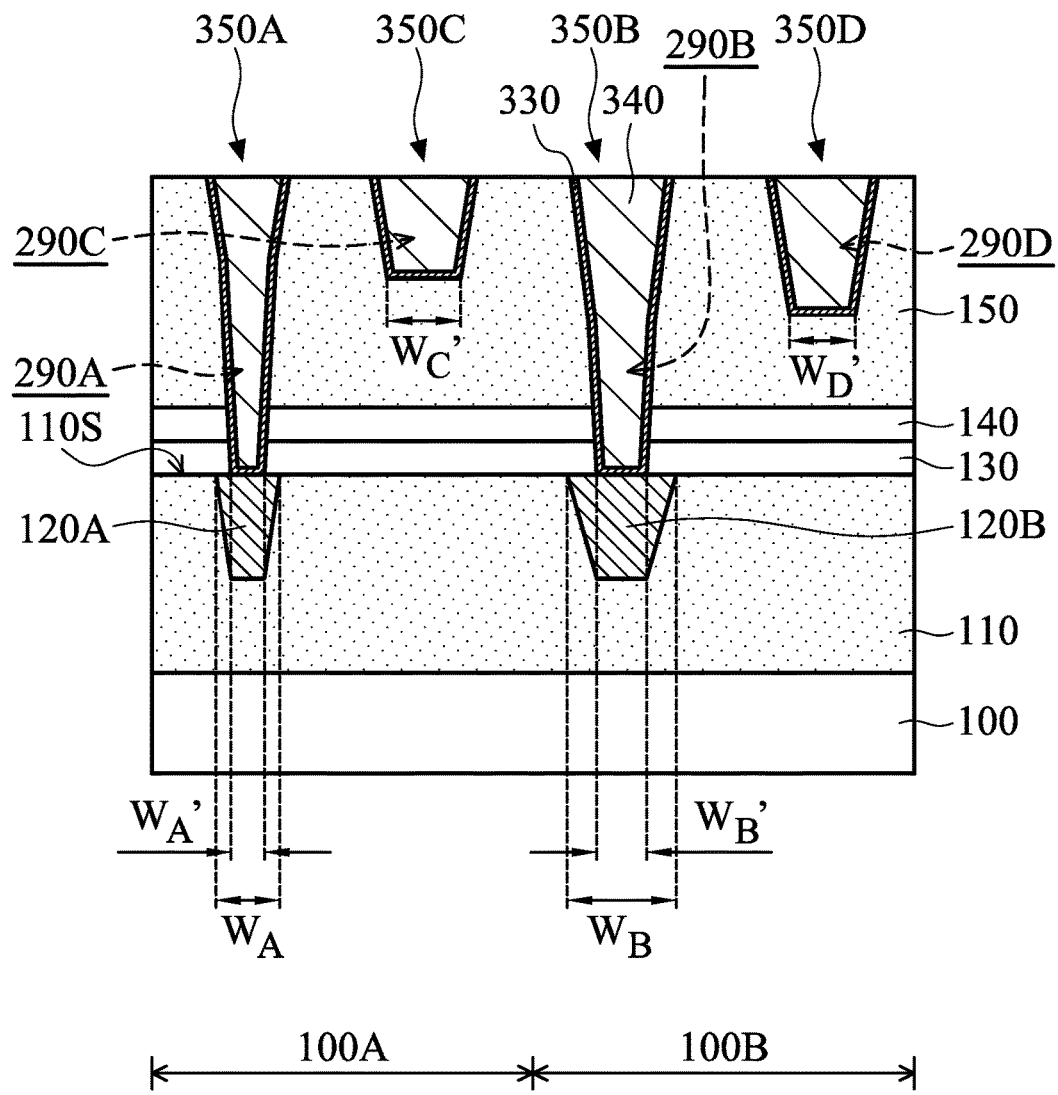

FIGS. 1A-1N are cross-sectional views of various stages of a process for forming a semiconductor device structure, in accordance with some embodiments. As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include silicon germanium, gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the semiconductor substrate 100. The device elements are not shown in figures for the purpose of simplicity and clarity. Examples of the various device elements include transistors, diodes, another suitable element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the semiconductor substrate 100. The isolation features are used to define active regions and electrically isolate various device elements formed in and/or over the semiconductor substrate 100 in the active regions. In some embodiments, the isolation features include shallow trench isolation (STI) features, local oxidation of silicon (LOCOS) features, other suitable isolation features, or a combination thereof.

In some embodiments, an interconnection structure (which will be described in more detail later) is formed over the semiconductor substrate 100 in regions 100A and 100B. The regions 100A and 100B may be referred to as active regions, but embodiments of the disclosure are not limited thereto. The interconnection structure includes multiple dielectric layers containing an interlayer dielectric (ILD)

layer and one or more inter-metal dielectric (IMD) layers. The interconnection structure also includes multiple conductive features formed in the ILD and IMD layers. The conductive features may include conductive lines, conductive vias, and/or conductive contacts. Various processes, such as back-end-of-line (BEOL) semiconductor fabrication processes, are performed to form the interconnection structure.

Various device elements are interconnected through the interconnection structure over the semiconductor substrate 100 to form integrated circuit devices. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

As shown in FIG. 1A, a dielectric layer 110 is deposited over the semiconductor substrate 100 in the regions 100A and 100B. The dielectric layer 110 may serve as an ILD or IMD layer of an interconnection structure. The dielectric layer 110 covers device elements formed in and/or over the semiconductor substrate 100. Although FIG. 1A shows that the dielectric layer 110 is a single layer, embodiments of the disclosure are not limited thereto. In some other embodiments, the dielectric layer 110 is a multi-layer structure including dielectric sub-layers (not shown).

In some embodiments, the dielectric layer 110 is made of or includes a low dielectric constant (low-k) material, an extreme low-k (ELK) material, silicon oxide, silicon oxynitride, borosilicate glass (BSG), phosphoric silicate glass (PSG), borophosphosilicate glass (BPSG), fluorinated silicate glass (FSG), one or more other suitable materials, or a combination thereof. In some embodiments, the dielectric layer 110 is deposited using a chemical vapor deposition (CVD) process, an atomic layer deposition (ALD) process, a spin-on process, a spray coating process, one or more other applicable processes, or a combination thereof.

The low-k or ELK material may have a smaller dielectric constant than that of silicon dioxide. For example, the low-k material may have a dielectric constant in a range from about 1.5 to about 3.5. The ELK material may have a dielectric constant, which is less than about 2.5 or in a range from about 1.5 to about 2.5. As the density of semiconductor devices increases and the size of circuit elements becomes smaller, the resistance capacitance (RC) delay time increasingly dominates circuit performance. Therefore, using a low-k or ELK material as the dielectric layer 110 is helpful in reducing the RC delay.

A wide variety of low-k or ELK material may be used for forming the dielectric layer 110. In some embodiments, the dielectric layer 110 is made of or includes a porous dielectric material, an organic polymer, an organic silica glass, SiOF series material, a hydrogen silsesquioxane (HSQ) series material, a methyl silsesquioxane (MSQ) series material, carbon doped silicon oxide, amorphous fluorinated carbon, parylene, benzocyclobutenes (BCB), polytetrafluoroethylene (PTFE) (Teflon), silicon oxycarbide polymers (SiOC), a porous organic series material, a spin-on inorganic dielectric, a spin-on organic dielectric, one or more other suitable materials, or a combination thereof.

Multiple conductive features are formed in the dielectric layer 110 in the regions 100A and 100B. Conductive features 120A and 120B formed in the dielectric layer 110 are shown in FIG. 1A as an example. However, embodiments of the disclosure are not limited thereto. The conductive features 120A and 120B are electrically connected to the device elements through other conductive features (not shown). For example, the conductive features 120A and 120B may be electrically connected to a gate structure formed on the semiconductor substrate 100 or a doped region formed in the semiconductor substrate 100 through suitable conductive features.

The conductive features 120A and 120B may include conductive lines, conductive vias, conductive contacts, or a combination thereof. In some embodiments, the conductive features 120A and 120B are made of or include copper, aluminum, tungsten, titanium, cobalt, nickel, gold, platinum, one or more other suitable materials, or a combination thereof. Various processes, including deposition, etching, planarization, or the like, may be used to form the conductive features 120A and 120B in the dielectric layer 110.

Although FIG. 1A shows that each of the conductive features 120A and 120B is a single layer, embodiments of the disclosure are not limited thereto. Each of the conductive features 120A and 120B may be a multi-layer structure including conductive sub-layers. For example, the conductive sub-layers include a metal-filling layer, a seed layer, a barrier layer, one or more other suitable layers, or a combination thereof. The conductive sub-layers are not shown in figures for the purpose of simplicity and clarity.

In accordance with some embodiments, the conductive features in the region 100A and the conductive features in the region 100B are different sizes. For example, in some embodiments, the conductive features in the region 100A are narrower than the conductive features in the region 100B. In some embodiments, the conductive features in the region 100A have a smaller horizontal area than that of the conductive features in the region 100B. However, embodiments of the disclosure are not limited thereto. The conductive features in the region 100A and the conductive features in the region 100B may be the same size.

As shown in FIG. 1A, the conductive feature 120A in the region 100A has a width $W_A$ and the conductive feature 120B in the region 100B has a width $W_B$. The width $W_A$ and the width $W_B$ may be measured along the top surface 110S of the dielectric layer 110. The width $W_A$ and the width $W_B$ may be referred to as top widths. In some embodiments, the width $W_A$ is in a range from about 10 nm to about 80 nm. In some embodiments, the width $W_B$ is in a range from about 10 nm to about 80 nm. These ranges are only examples and are not a limitation to the disclosure. In some embodiments, the width $W_A$ is less than the width $W_B$, as shown in FIG. 1A. In some embodiments, the conductive feature 120A has a smaller horizontal area than that of the conductive feature 120B.

As shown in FIG. 1B, a barrier layer 130 is deposited over the dielectric layer 110, in accordance with some embodiments. The barrier layer 130 covers the conductive features 120A and 120B. The barrier layer 130 is thinner than the dielectric layer 110. The barrier layer 130 may also be referred to as a silicide-blocking layer or a silicidation-blocking layer. The barrier layer 130 may prevent metal ions of the conductive features 120A and 120B from diffusing into a subsequently formed dielectric layer (which will be described in more detail later). The barrier layer 130 may also serve as an etch stop layer in a subsequent etching process.

In some embodiments, the barrier layer 130 is made of or includes a dielectric material, such as silicon oxide, aluminum oxide, silicon nitride, silicon carbide, silicon oxynitride, one or more other suitable materials, or a combination thereof. In some embodiments, the barrier layer 130 is deposited using a CVD process, an ALD process, a physical vapor deposition (PVD) process, one or more other applicable processes, or a combination thereof. Many variations and/or modifications can be made to embodiments of the disclosure. In some other embodiments, the barrier layer 130 is not formed.

As shown in FIG. 1B, a dielectric layer 140 is deposited over the dielectric layer 110, in accordance with some embodiments. The dielectric layer 140 covers the barrier layer 130. The dielectric layer 140 is thinner than the dielectric layer 110. The dielectric layer 140 may improve the adhesion between the barrier layer 130 and a subsequently formed dielectric layer. The dielectric layer 140 may also relieve stress in the interconnection structure. The dielectric layer 140 may also serve as an etch stop layer in a subsequent etching process.

In some embodiments, the dielectric layer 140 is made of or includes tetraethyl orthosilicate (TEOS), inorganic oxide, silicon nitride, silicon oxynitride, silicon carbide, one or more other suitable materials, or a combination thereof. In some embodiments, the dielectric layer 140 is deposited using a CVD process, a PVD process, one or more other applicable processes, or a combination thereof. Many variations and/or modifications can be made to embodiments of the disclosure. In some other embodiments, the dielectric layer 140 is not formed.

As shown in FIG. 1B, a dielectric layer 150 is deposited over the dielectric layer 110. In some embodiments, the dielectric layer 150 covers the conductive features 120A and 120B, the barrier layer 130 and the dielectric layer 140. The dielectric layer 150 may serve as an IMD layer of an interconnection structure. Although FIG. 1B shows that the dielectric layer 150 is a single layer, embodiments of the disclosure are not limited thereto. In some other embodiments, the dielectric layer 150 is a multi-layer structure including dielectric sub-layers (not shown). As mentioned above, the barrier layer 130 may prevent metal ions of the conductive features 120A and 120B from diffusing into the dielectric layer 150.

In some embodiments, the dielectric layer 150 is made of or includes a low-k material, an ELK material, silicon oxide, silicon oxynitride, BSG, PSG, BPSG, FSG, one or more other suitable materials, or a combination thereof. In some embodiments, the dielectric layer 150 and the dielectric layer 110 are made of or include the same material, such as an ELK material so as to reduce the RC delay. In some embodiments, the dielectric layer 150 is deposited using a CVD process, an ALD process, a spin-on process, a spray coating process, one or more other applicable processes, or a combination thereof.

As shown in FIG. 1B, an anti-reflective coating (ARC) layer 160 is deposited over the dielectric layer 150, in accordance with some embodiments. The ARC layer 160 may absorb light thereby minimizing reflection during a subsequent photolithography process so as to enhance the resolution of the photolithography process. In some embodiments, the ARC layer 160 is made of or includes SiON, SiCN, SiN, HfO, $Al_2O_3$, $Ta_2O_5$, ZrO, one or more other suitable materials, or a combination thereof. In some embodiments, the ARC layer 160 is a nitrogen-free antireflective coating (NFARC) layer. By keeping an interface between the dielectric layer 150 and the ARC layer 160 nitrogen free, little or no nitrogen diffuses into the dielectric layer 150 so as to prevent contamination. In some embodiments, the ARC layer 160 is deposited using a spray coating process, a spin-on process, a CVD process, an ALD process, one or more other applicable processes, or a combination thereof.

As shown in FIG. 1B, a hard mask layer 170 is deposited over the dielectric layer 150, in accordance with some embodiments. In some embodiments, the hard mask layer 170 covers the ARC layer 160. In some embodiments, the hard mask layer 170 is made of or includes titanium nitride (TiN), SiON, one or more other suitable materials, or a combination thereof. In some other embodiments, the hard mask layer 170 is a multi-layer structure, such as oxide-nitride-oxide (ONO) layers. In some embodiments, the hard mask layer 170 is deposited using a PVD process (such as a radio-frequency PVD (RFPVD) process), a CVD process, an ALD process, one or more other applicable processes, or a combination thereof.

As shown in FIG. 1B, an ARC layer 180 is deposited over the dielectric layer 150, in accordance with some embodiments. In some embodiments, the ARC layer 180 covers the hard mask layer 170. In some embodiments, the ARC layer 180 is made of or includes SiON, SiCN, SiN, HfO, $Al_2O_3$, $Ta_2O_5$, ZrO, one or more other suitable materials, or a combination thereof. In some embodiments, the ARC layer 180 and the ARC layer 160 are made of or include the same material. In some embodiments, the ARC layer 180 is an NFARC layer. In some embodiments, the ARC layer 180 is deposited using a spray coating process, a spin-on process, a CVD process, an ALD process, one or more other applicable processes, or a combination thereof.

In some embodiments, the ARC layer 160, the hard mask layer 170 and the ARC layer 180 together form a tri-layer hard mask. However, embodiments of the disclosure are not limited thereto. In some other embodiments, the ARC layer 160 is not formed. In some other embodiments, the ARC layer 180 is not formed.

Afterwards, a patterned mask structure is formed over the dielectric layer 150. A multi-layer mask structure including a bottom layer 190, a middle layer 200 and a top layer 210 is shown in FIG. 1C as an example. However, embodiments of the disclosure are not limited thereto. In some other embodiments, the mask structure is a single layer or includes fewer or more than three layers.

As shown in FIG. 1C, the bottom layer 190, the middle layer 200 and the top layer 210 are sequentially deposited over the hard mask layer 170, in accordance with some embodiments. In some embodiments, the bottom layer 190, the middle layer 200 and the top layer 210 are made of or include a photoresist or photo-sensitive material, one or more other suitable materials, or a combination thereof. In some embodiments, the bottom layer 190 is made of or includes $C_xH_yO_z$, the middle layer 200 is made of or includes $SiC_xH_yO_z$, and the top layer 210 is made of or includes $C_xH_yO_z$, but embodiments of the disclosure are not limited thereto. In some embodiments, the bottom layer 190, the middle layer 200 and the top layer 210 are deposited using a PVD process, a CVD process, a spin-on process, another applicable process, or a combination thereof.

The top layer 210 is patterned to form the patterned mask structure. As a result, multiple openings (or trenches) are formed in the top layer 210. Openings 210A and 210B respectively formed in the regions 100A and 100B are shown in FIG. 1C as an example. However, embodiments of the disclosure are not limited thereto.

The openings 210A and 210B partially expose the middle layer 200. In some embodiments, the openings 210A and 210B substantially align to or longitudinally overlap the conductive features 120A and 120B, respectively. In some embodiments, the openings 210A and 210B are substantially the same size. The top layer 210 is patterned by a photolithography process, which may include one or more exposure, developing, rinsing, and baking processes (performed in any logical order).

Afterwards, the middle layer 200 is patterned or etched using the patterned top layer 210 as an etch mask. As a result, the openings 210A and 210B are transferred into the middle layer 200 (not shown). The patterned top layer 210 may be removed during the patterning of the middle layer 200. Similarly, the bottom layer 190 is then patterned or etched using the patterned middle layer 200 as an etch mask. As a result, the openings 210A and 210B are transferred into the bottom layer 190 (not shown). The patterned middle layer 200 may be removed during the patterning of the bottom layer 190.

The patterned bottom layer 190 is subsequently used as an etch mask to pattern various underlying layers, such as the hard mask below the bottom layer 190. More specifically, the ARC layer 180 is patterned and etched using the patterned bottom layer 190 as an etch mask. In some embodiments, the hard mask layer 170 is partially removed during the patterning of the ARC layer 180. As a result, multiple openings (or trenches) are formed in the ARC layer 180 and the hard mask layer 170. Openings 220A and 220B respectively formed in the regions 100A and 100B are shown in FIG. 1D as an example. The openings 220A and 220B penetrate through the ARC layer 180 and extend into the hard mask layer 170. However, embodiments of the disclosure are not limited thereto. In some other embodiments, the hard mask layer 170 is not removed during the patterning of the ARC layer 180.

In some embodiments, the middle layer 200, the bottom layer 190 and the ARC layer 180 are sequentially patterned using one or more etching processes, one or more other applicable processes, or a combination thereof. The etching process may be a dry etching process, one or more other applicable processes, or a combination thereof. In some embodiments, the bottom layer 190 and/or the middle layer 200 remain over the ARC layer 180. The remaining bottom layer 190 and/or the remaining middle layer 200 may be removed using an ashing process, one or more other applicable processes, or a combination thereof.

The opening 220A in the region 100A has a width $W_1$ and the opening 220B in the region 100B has a width $W_2$. The width $W_1$ and the width $W_2$ may be measured along the top surface of the ARC layer 180. In some embodiments, the width $W_1$ is substantially equal to the width $W_2$, as shown in FIG. 1D. In some embodiments, the openings 220A and 220B are substantially the same size. In some embodiments, the openings 220A and 220B gradually shrink along a direction from the dielectric layer 150 towards the dielectric layer 110. As a result, the openings 220A and 220B have inclined sidewalls, but embodiments of the disclosure are not limited thereto.

Afterwards, the same or similar steps as those described in FIG. 1C are performed over the structure shown in FIG. 1D, in accordance with some embodiments. A patterned mask structure is formed over the patterned ARC layer 180. A multi-layer mask structure including a bottom layer 230, a middle layer 240 and a top layer 250 is shown in FIG. 1E as an example. However, embodiments of the disclosure are not limited thereto. In some other embodiments, the mask structure is a single layer or includes fewer or more than three layers.

In some embodiments, the bottom layer 230 fills up the openings 220A and 220B, as shown in FIG. 1E. The materials and/or formation methods of the bottom layer 230, the middle layer 240 and the top layer 250 are the same as or similar to those of the bottom layer 190, the middle layer 200 and the top layer 210, as illustrated in the aforementioned embodiments, and therefore are not repeated.

Similar to the steps described in FIG. 1C, the top layer 250 is patterned so that multiple openings (or trenches) including openings 250C and 250D are formed in the top layer 250, as shown in FIG. 1E. The openings 250C and 250D partially expose the middle layer 240. In some embodiments, the openings 250C and 250D do not overlap the conductive features 120A and 120B. In some embodiments, the openings 250C and 250D are substantially the same size.

Afterwards, the same or similar steps as those described in FIG. 1D are performed over the structure shown in FIG. 1E. The middle layer 240 and the bottom layer 230 are sequentially patterned or etched using one or more etching processes, one or more other applicable processes, or a combination thereof. The ARC layer 180 is then patterned and etched using the patterned bottom layer 230 as an etch mask. The remaining bottom layer 230 and/or the remaining middle layer 240 over the ARC layer 180 may be removed using an ashing process, one or more other applicable processes, or a combination thereof.

Subsequently, the hard mask layer 170 is patterned and etched using the patterned ARC layer 180 as an etch mask. As a result, other openings (or trenches) are formed in the hard mask layer 170. Openings 220C and 220D respectively formed in the regions 100A and 100B are shown in FIG. 1F as an example. The previously formed openings 220A and 220B extend to penetrate through the hard mask layer 170 during the patterning of the hard mask layer 170. Accordingly, the hard mask layer 170 is patterned to have the openings 220A, 220B, 220C and 220D. The interval between the openings 220A, 220B, 220C and 220D shown in FIG. 1F is less than the interval between the openings 220A and 220B shown in FIG. 1D. The steps described in FIGS. 1C-1F may be referred to as a double patterning process.

As shown in FIG. 1F, the opening 220C is between the openings 220A and 220B. The opening 220B is between the openings 220C and 220D. The openings 220C and 220D penetrate through the ARC layer 180 and the hard mask layer 170. In some embodiments, the ARC layer 160 is partially removed during the patterning of the hard mask layer 170. The openings 220A, 220B, 220C and 220D extend into the ARC layer 160, as shown in FIG. 1F. However, embodiments of the disclosure are not limited thereto. In some other embodiments, the ARC layer 160 is not removed during the patterning of the hard mask layer 170.

The opening 220C has a width $W_3$ and the opening 220D has a width $W_4$. The width $W_3$ and the width $W_4$ may be measured along the top surface of the ARC layer 180. In some embodiments, the width $W_3$ is substantially equal to the width $W_4$, as shown in FIG. 1F. In some embodiments, the openings 220C and 220D are substantially the same size. In some embodiments, the width $W_3$ is substantially equal to the width $W_1$, the width $W_2$ and the width $W_4$. In some embodiments, the openings 220A, 220B, 220C and 220D are substantially the same size. In some embodiments, the openings 220A, 220B, 220C and 220D have substantially the same shape or profile, as shown in FIG. 1F.

Afterwards, the same or similar steps as those described in FIG. 1C or 1E are performed over the structure shown in FIG. 1F, in accordance with some embodiments. A patterned mask structure is formed over the patterned hard mask including the ARC layer 160, the hard mask layer 170 and the ARC layer 180. A multi-layer mask structure including a bottom layer 260, a middle layer 270 and a top layer 280 is shown in FIG. 1G as an example. However, embodiments of the disclosure are not limited thereto. In some other embodiments, the mask structure is a single layer or includes less or greater than three layers.

In some embodiments, the bottom layer 260 fills up the openings 220A, 220B, 220C and 220D in the patterned hard mask, as shown in FIG. 1G. The materials and/or formation methods of the bottom layer 260, the middle layer 270 and the top layer 280 are the same as or similar to those of the bottom layer 190, the middle layer 200 and the top layer 210, as illustrated in the aforementioned embodiments, and therefore are not repeated.

Similar to the steps described in FIG. 1C or 1E, the top layer 280 is patterned so that multiple openings (or trenches) including openings 280A and 280B are formed in the top layer 280, as shown in FIG. 1G. The openings 280A and 280B partially expose the middle layer 270. In some embodiments, the openings 280A and 280B substantially align to or longitudinally overlap the conductive features 120A and 120B, respectively. In some embodiments, the openings 280A and 280B are substantially the same size.

Afterwards, the same or similar steps as those described in FIG. 1D or 1F are performed over the structure shown in FIG. 1G. The middle layer 270, the bottom layer 260, the ARC layer 160 and the dielectric layer 150 are sequentially patterned or etched using one or more etching processes, one or more other applicable processes, or a combination thereof. As a result, multiple via holes are formed in the dielectric layer 150. Via holes 290A and 290B respectively formed in the regions 100A and 100B are shown in FIG. 1H as an example. The openings 280A and 280B define the locations and dimensions of the via holes 290A and 290B. The remaining bottom layer 260 and/or the remaining middle layer 270 over the ARC layer 180 may be removed using an ashing process, one or more other applicable processes, or a combination thereof.

As shown in FIG. 1H, the via holes 290A and 290B extend from the bottom of the openings 220A and 220B, respectively. In some embodiments, the via holes 290A and 290B substantially align to or longitudinally overlap the conductive features 120A and 120B, respectively. In some embodiments, the via holes 290A and 290B penetrate through the ARC layer 160 and extend into the dielectric layer 150.

The via hole 290A has a width $W_5$ and the via hole 290B has a width $W_6$. The width $W_5$ and the width $W_6$ may be measured along the top surface of the ARC layer 160 or the dielectric layer 150. The width $W_5$ and the width $W_6$ may be referred to as top widths. In some embodiments, the width $W_5$ is in a range from about 30 nm to about 200 nm. In some embodiments, the width $W_6$ is in a range from about 30 nm to about 200 nm. These ranges are only examples and are not a limitation to the disclosure.

In some embodiments, the width $W_5$ is substantially equal to the width $W_6$, as shown in FIG. 1H. In some embodiments, the via holes 290A and 290B are substantially the same size. In some embodiments, the via holes 290A and 290B gradually shrink along a direction from the dielectric layer 150 towards the dielectric layer 110. As a result, the via holes 290A and 290B have inclined sidewalls, but embodiments of the disclosure are not limited thereto. In some embodiments, the via holes 290A and 290B have substantially the same shape or profile, as shown in FIG. 1H.

As shown in FIG. 1I, a dielectric layer 300 is deposited over the dielectric layer 150 in the regions 100A and 100B, in accordance with some embodiments. In some embodiments, the dielectric layer 300 covers and adjoins the ARC layer 160, the hard mask layer 170 and the ARC layer 180. In some embodiments, the dielectric layer 300 is in direct contact with the dielectric layer 150. In some embodiments, the dielectric layer 300 extends in the via holes 290A and 290B without filling up the via holes 290A and 290B.

The dielectric layer 300 will be removed during a subsequent process and therefore may be referred to as a sacrificial dielectric layer. In some embodiments, the dielectric layer 300 is conformally deposited and has a substantially uniform thickness. Accordingly, the dielectric layer 300 may also be referred to as a conformal layer. In some embodiments, the thickness of the dielectric layer 300 is in a range from about 1 nm to about 45 nm, such as in a range from about 1 nm to about 4 nm. These ranges are only examples and are not a limitation to the disclosure. In some embodiments, the dielectric layer 300 is deposited using an ALD process, one or more other applicable processes, or a combination thereof. The dielectric layer 300 may also be referred to as an ALD layer.

In some embodiments, the dielectric layer 300 is made of or includes a silicon-based material, an oxide material, a nitride material, one or more other suitable materials, or a combination thereof. In some embodiments, the dielectric layer 300 is made of or includes a low low-k material, an ELK material, silicon oxide, silicon oxycarbide, silicon oxynitride, BSG, PSG, BPSG, FSG, one or more other suitable materials, or a combination thereof. In some embodiments, the dielectric layer 300 and the dielectric layer 150 are made of or include the same material or similar dielectric materials. For example, the dielectric layer 300 and the dielectric layer 150 may have similar or substantially the same etch resistance.

Due to the uniform dielectric layer 300, the via hole 290A shrinks and becomes narrower and shallower. The via hole 290B also shrinks and becomes narrower and shallower. As a result, the via hole 290A has a lowered width $W_5'$ and the via hole 290B has a lowered width $W_6'$. In some embodiments, the width $W_5'$ is in a range from about 20 nm to about 150 nm. In some embodiments, the width $W_6'$ is in a range from about 20 nm to about 150 nm. These ranges are only examples and are not a limitation to the disclosure.

In some embodiments, the width $W_5'$ is substantially equal to the width $W_6'$, as shown in FIG. 1I. In some embodiments, the difference between the width $W_5'$ and the width $W_5$ is substantially equal to about two times the thickness of the dielectric layer 300. In some embodiments, the difference between the width $W_6'$ and the width $W_6$ is substantially equal to about two times the thickness of the dielectric layer 300. Similarly, due to the uniform dielectric layer 300, the openings 220A, 220B, 220C and 220D shrinks and becomes narrower and shallower.

As shown in FIG. 1J, a patterned mask layer 310 is formed over the dielectric layer 300, in accordance with some embodiments. The mask layer 310 covers the dielectric layer 300 in the region 100A and fills up the via hole 290A and the openings 220A and 220C. The mask layer 310 exposes the dielectric layer 300 in the region 100B, the via hole 290B, and the openings 220B and 220D. In some embodiments, the mask layer 310 is made of or includes a photoresist or photo-sensitive material, one or more other suitable materials, or a combination thereof.

Afterwards, an etching process 320 is performed over the mask layer 310, as shown in FIG. 1J in accordance with some embodiments. The etching process 320 is a dry etching process, one or more other applicable processes, or a combination thereof. The mask layer 310 is then removed using an ashing process, one or more other applicable processes, or a combination thereof.

The dielectric layer 300 in the region 100B that is exposed from the mask layer 310 is removed during the etching process 320, as shown in FIG. 1K. As a result, the via hole 290B and the openings 220B and 220D enlarge and become wider and deeper. For example, the via hole 290B has the original width $W_6$ greater than the width $W_6'$ due to the removal of the dielectric layer 300 in the region 100B. In some embodiments, the width $W_6$ of the via hole 290B shown in FIG. 1K is in a range from about 30 nm to about 200 nm. However, embodiments of the disclosure are not limited thereto. The via hole 290B may have an increased width that is greater than the original width $W_6$ and the width $W_6'$.

The dielectric layer 300 in the region 100A that is covered by the mask layer 310 remains over the dielectric layer 150 after the etching process 320. As a result, the via hole 290A becomes narrower and shallower than the via hole 290B. For example, the width $W_5'$ of the via hole 290A is less than the width $W_6$ of the via hole 290B, as shown in FIG. 1K. Similarly, the openings 220A and 220C become narrower and shallower than the openings 220B and 220D.

In some embodiments, the difference between the width W5' of the via hole 290A and the width W6 of the via hole 290B shown in FIG. 1J is substantially equal to about two times the thickness of the dielectric layer 300. However, embodiments of the disclosure are not limited thereto. In some other embodiments, the difference between the width W5' of the via hole 290A and the width W6 of the via hole 290B shown in FIG. 1J is greater than about two times the thickness of the dielectric layer 300.

In some embodiments, the ARC layer 160 in the region 100B that is exposed from the mask layer 310 is partially removed during the etching process 320, as shown in FIG. 1K. As a result, the openings 220B and 220D become deeper. For example, the opening 220B shown in FIG. 1K is deeper than the openings 220A and 220B shown in FIG. 1H. The opening 220D shown in FIG. 1K is deeper than the openings 220C and 220D shown in FIG. 1H.

In some embodiments, the etchant used in the etching process 320 has a low etch selectivity of the dielectric layer 300 to the dielectric layer 150. Accordingly, the dielectric layer 150 in the region 100B that is under the via hole 290B is partially removed during the etching process 320, as shown in FIG. 1K. It can be ensured that the dielectric layer 300 in the region 100B is removed until the dielectric layer 150 is exposed. As a result, the via hole 290B shown in FIG. 1K becomes deeper than the via hole 290B shown in FIG. 1H. In some embodiments, the etchant used in the etching process 320 has a high etch selectivity of the dielectric layer 300 with respect to the ARC layer 180, the hard mask layer 170 and the ARC layer 160.

Afterwards, the dielectric layer 300 remaining in the region 100A is removed, and the dielectric layer 150 in the regions 100A and 100B is partially removed through the via holes 290A and 290B, as shown in FIG. 1L in accordance with some embodiments. As a result, the via holes 290A and 290B extend to penetrate through the dielectric layer 150, the dielectric layer 140 and the barrier layer 130. The conductive features 120A and 120B in the dielectric layer 110 become exposed through the via holes 290A and 290B.

In some embodiments, the dielectric layer 300 in the region 100A and the dielectric layer 150 are removed using an etching process, such as a dry etching process, one or more other applicable processes, or a combination thereof.

In some embodiments, the etchant used in the etching process has a low etch selectivity of the dielectric layer 300 to the dielectric layer 150. The etching rate of the dielectric layer 300 is substantially equal to or less than the etching rate of the dielectric layer 150, but embodiments of the disclosure are not limited thereto. In some embodiments, the ARC layer 180 is removed during or after the removal of the dielectric layer 300 and the dielectric layer 150.

After the etching process, the via hole 290A has a width $W_A'$ and the via hole 290B has a width $W_B'$. The width $W_A'$ and the width $W_B'$ may be measured along the top surface 110S of the dielectric layer 110. The width $W_A'$ and the width $W_B'$ may be referred to as bottom widths. In some embodiments, the width $W_A'$ is in a range from about 10 nm to about 100 nm. In some embodiments, the width $W_B'$ is in a range from about 20 nm to about 180 nm. These ranges are only examples and are not a limitation to the disclosure.

In some embodiments, the width $W_A'$ is less than the width $W_B'$, as shown in FIG. 1L. In some embodiments, the width $W_A'$ is less than the width $W_A$ of the conductive feature 120A. As a result, the conductive feature 120A is partially exposed through the via hole 290A. In some embodiments, the conductive feature 120A is not entirely exposed through the via hole 290A. In some embodiments, the width $W_B'$ is less than the width $W_B$ of the conductive feature 120B. As a result, the conductive feature 120B is partially exposed through the via hole 290B. In some embodiments, the conductive feature 120B is not entirely exposed through the via hole 290B. In some embodiments, the width $W_B'$ is greater than the width $W_A$ of the conductive feature 120A, but embodiments of the disclosure are not limited thereto.

As shown in FIG. 1L, trenches 290C and 290D are formed in the dielectric layer 150 during the removal of the dielectric layer 300 and the dielectric layer 150, in accordance with some embodiments. The openings 220C and 220D define the locations and dimensions of the trenches 290C and 290D. In some embodiments, the trenches 290C and 290D extend from the bottom of the openings 220C and 220D, respectively. In some embodiments, the trenches 290C and 290D penetrate through the ARC layer 160 and extend into the dielectric layer 150. The trenches 290C and 290D do not penetrate through the dielectric layer 150 so that the trenches 290C and 290D are shallower than the via holes 290A and 290B. In some embodiments, the trenches 290C and 290D are different sizes, as shown in FIG. 1L. For example, the trench 290C is shallower and/or narrower than the trench 290D.

Afterwards, conductive features are formed in the via holes 290A and 290B and the trenches 290C and 290D to form a part of the interconnection structure. The conductive features in the dielectric layer 150 are electrically connected to the conductive features 120A and 120B in the dielectric layer 110. The conductive features in the dielectric layer 150 may be a single damascene structure, a dual damascene structure, or a combination thereof.

More specifically, a barrier layer 330 is deposited over the hard mask layer 170, as shown in FIG. 1M in accordance with some embodiments. The barrier layer 330 extends in the via holes 290A and 290B and the trenches 290C and 290D. The sidewalls and the bottom of the via holes 290A and 290B and the trenches 290C and 290D are covered by the barrier layer 330. The barrier layer 330 may prevent metal ions of a subsequently deposited conductive material (which will be described in more detail later) from diffusing into the dielectric layer 150 during thermal processes or cycles. The barrier layer 330 may also referred to as a diffusion barrier layer.

In some embodiments, the barrier layer 330 is made of or includes a refractory metal material, such as tantalum (Ta), titanium (Ti), tantalum nitride, titanium nitride, one or more other suitable materials, or a combination thereof. In some embodiments, the barrier layer 330 is deposited using a PVD process, an ALD process, one or more other applicable processes, or a combination thereof. In some embodiments, the barrier layer 330 is deposited conformally.

Many variations and/or modifications can be made to embodiments of the disclosure. In some other embodiments, the barrier layer 330 includes multiple sub-layers (not shown). For example, the sub-layers may include a seed layer, a glue layer, one or more other suitable sub-layers, or a combination thereof. The seed layer may be used to assist a subsequent deposition process. The seed layer may be made of or include a metal material, such as copper, aluminum, tungsten, titanium, nickel, one or more other suitable materials, or a combination thereof. The glue layer may be used to improve adhesion between a diffusion barrier layer and a subsequently deposited conductive material. The glue layer may be made of or include tantalum, titanium, one or more other suitable materials, or a combination thereof. Many variations and/or modifications can be made to embodiments of the disclosure. In some other embodiments, the barrier layer 330 is not formed.

As shown in FIG. 1M, a conductive material 340 is deposited over the barrier layer 330, in accordance with some embodiments. The conductive material 340 covers the hard mask layer 170 and extends into the via holes 290A and 290B and the trenches 290C and 290D. As a result, the conductive material 340 and the barrier layer 330 together fill up the via holes 290A and 290B and the trenches 290C and 290D.

In some embodiments, the conductive material 340 is made of or includes copper, aluminum, tungsten, titanium, nickel, gold, platinum, silver, one or more other suitable materials, or a combination thereof. The conductive material 340 may be a single layer or have multiple stacked layers. In some embodiments, the conductive material 340 is deposited using an electroplating process, a PVD process, a CVD process, an electroless plating process, another applicable process, or a combination thereof.

Afterwards, a planarization process is used to remove the excess conductive material 340 and the barrier layer 330 outside of the via holes 290A and 290B and the trenches 290C and 290D. The planarization process may include a chemical mechanical polishing (CMP) process, a dry polishing process, a grinding process, an etching process, another applicable process, or a combination thereof. As a result, the remaining portions of the conductive material 340 and the barrier layer 330 in the via holes 290A and 290B and the trenches 290C and 290D form conductive features 350A, 350B, 350C and 350D, respectively. As mentioned above, the barrier layer 330 may prevent metal ions of the conductive features 350A, 350B, 350C and 350D from diffusing into an overlying dielectric layer.

As shown in FIG. 1N, the conductive feature 350A in the via hole 290A has a width $W_A'$ and the conductive feature 350B in the via hole 290B has a width $W_B'$ that is greater than the width $W_A'$, in accordance with some embodiments. In some embodiments, the conductive feature 350C in the via hole 290C has a width $W_C'$ and the conductive feature 350D in the via hole 290D has a width $W_D'$. The width $W_D'$ may be less than the width $W_C'$. The width $W_C'$ and the width $W_D'$ are greater than the width $W_A'$ and the width $W_B'$. The conductive feature 350C and the conductive feature 350D have different depths in the dielectric layer 150. The conductive feature 350C is shallower than the conductive feature 350D, as shown in FIG. 1N.

Afterwards, one or more dielectric layers and multiple conductive features are formed on the dielectric layer 150 and the conductive features 350A, 350B, 350C and 350D to continue the formation of the interconnection structure of the semiconductor device structure. In some embodiments, the operations illustrated in FIGS. 1B-1N are repeated one or more times to continue the formation of the interconnection structure. For example, another barrier layer, which may be the same as or similar to the barrier layer 130, may be deposited to cover the dielectric layer 150 and the conductive features 350A, 350B, 350C and 350D. In some embodiments, another dielectric layer, which may be the same as or similar to the dielectric layer 300, may be deposited to assist the formation of conductive features over the dielectric layer 150.

An interconnection structure includes multiple stacked layers, which include multiple conductive features. A first or second layer may have a smaller critical dimension (CD) than a third or fourth layer over the first or second layer. Compared to the third or fourth layer, the first or second layer may be formed using relatively advanced technology. For example, the line-width of the first or second layer may be in a range from about 20 nm to about 30 nm while the line-width of the third or fourth layer may be in a range from about 40 nm to about 100 nm. It should be noted that these ranges are only examples and are not a limitation to the disclosure.

In some cases, a dielectric layer is deposited over the second layer to form the third layer. Via holes are formed in the dielectric layer to expose conductive features in the second layer. The via holes in the dielectric layer define the locations and dimensions of conductive features in the third layer. Since the conductive features in the second layer may have a smaller CD than the conductive features in the third layer, the via holes may be wider than the conductive features in the second layer. The via holes may extend into the second layer so that the sidewalls of the conductive features in the second layer may be exposed through the via holes. As a result, voids or vacancies may leave in the second layer. It may become difficult to construct reliable electrical connection paths between the second and third layers. The voids may form the source of defects. For example, high resistance, current leakage or even short circuiting may be induced since metal ions of the conductive features in the second layer may diffuse through the voids during thermal processes or cycles.

In accordance with some embodiments, the via holes 290A and 290B are partially formed in the dielectric layer 150, as shown in FIG. 1H. The sacrificial dielectric layer 300 is conformally deposited over the dielectric layer 150 and fills the via holes 290A and 290B, as shown in FIG. 1I. The dielectric layer 300 in the via hole 290B is removed, as shown in FIG. 1K. Due to the deposition and partial removal of the dielectric layer 300, the via holes 290A and 290B are different sizes, such as widths. The thickness of the dielectric layer 300 can be fine-tuned to control the size of the via hole 290A so as to meet requirements.

Afterwards, the dielectric layer 150 is etched again so that the via holes 290A and 290B extend to expose the conductive features 120A and 120B with different widths, as shown in FIG. 1L. Since the conductive feature 120A is narrower than the conductive feature 120B, the via hole 290A is formed to be narrower than the via hole 290B. As a result, the conductive feature 350A formed in the via hole 290A is narrower than the conductive feature 350B formed in the via hole 290B, as shown in FIG. 1N.

The conductive feature 350A has a bottom width (i.e., the width $W_A'$) less than the width $W_A$ of the conductive feature 120A. Due to the narrowed via hole 290A, the barrier layer 330 of the conductive feature 350A is prevented from being removed or damaged during the etching of the dielectric layer 150. The conductive feature 350B has a bottom width (i.e., the width $W_B'$) less than the width $W_B$ of the conductive feature 120B. In some embodiments, there is substantially no void or vacancy in the dielectric layer 110 or around the conductive features 120A and 120B. Accordingly, reliable electrical connection paths can be constructed in the interconnection structure. High resistance, current leakage or short circuiting, which may be induced by metal diffusion due to voids, is reduced or eliminated. Therefore, the semiconductor device structure has improved device performance and reliability.

In some embodiments, the formation method shown in FIGS. 1A-1N is used to form an interconnection structure of a semiconductor device. However, embodiments of the disclosure are not limited. In some other embodiments, the formation method described in the disclosure can be used to form any suitable structure including features with different widths at different levels.

Embodiments of the disclosure can be applied to a single damascene structure, a dual damascene structure, or a combination thereof. Embodiments of the disclosure can be applied to not only a semiconductor device structure with planar FETs but also a semiconductor device structure with FinFETs or other applicable devices. Embodiments of the disclosure are not limited and may be applied to fabrication processes for any suitable technology generation. Various technology generations include a 28 nm node, a 20 nm node, a 16 nm node, a 10 nm node, a 7 nm node, a 5 nm node, or another suitable node.

Embodiments of the disclosure provide a formation method of a semiconductor device structure. The semiconductor device structure includes a first conductive feature and a dielectric layer covering the first conductive feature. The dielectric layer includes a via hole. The formation method includes conformally depositing a sacrificial dielectric layer to shrink the via hole so that the via hole becomes narrower. The formation method also includes etching the dielectric layer until the first conductive feature is exposed through the narrowed via hole. The formation method further includes forming a second conductive feature in the narrowed via hole to be electrically connected to the first conductive feature. As a result, the bottom width of the second conductive feature is less than the top width of the first conductive feature. No void is formed in the dielectric layer or around the first conductive feature during or after the formation of the via hole. High resistance, current leakage or short circuiting, which may be induced by metal diffusion due to voids, is reduced or eliminated. Therefore, the semiconductor device structure has enhanced device performance and reliability.

Furthermore, the dimensions of the narrowed via hole can be fine-tuned by altering the thickness of the sacrificial dielectric layer. It becomes flexible to control the dimensions of conductive features. For example, the conductive features in the same level may be different sizes. The conformal deposition (such as an ALD process) of the sacrificial dielectric layer may assist to accurately control the dimensions of the narrowed via hole. In addition, even if photolithography and/or etching processes for forming a via hole face critical limitations or challenges, the described formation method can be applied to form a via hole or any suitable opening with much smaller sizes.

In accordance with some embodiments, a method for forming a semiconductor device structure is provided. The method includes forming a dielectric layer over a first conductive feature and a second conductive feature. The dielectric layer includes a first via hole and a second via hole. The method also includes depositing a conformal layer in the first via hole and the second via hole to cover the dielectric layer. The method further includes removing the conformal layer in the second via hole. The dielectric layer remains covered by the conformal layer in the first via hole after the removal of the conformal layer in the second via hole. In addition, the method includes etching the conformal layer in the first via hole and the dielectric layer until the first conductive feature and the second conductive feature become exposed through the first via hole and the second via hole, respectively. The method also includes forming a third conductive feature in the first via hole and a fourth conductive feature in the second via hole.

In accordance with some embodiments, a method for forming a semiconductor device structure is provided. The method includes forming a first conductive feature and a second conductive feature in a first dielectric layer. The first width of the first conductive feature is less than the second width of the second conductive feature. The method also includes forming a second dielectric layer over a top surface of the first dielectric layer. The method further includes etching the second dielectric layer to form a first via hole and a second via hole. In addition, the method includes depositing a sacrificial dielectric layer in the first via hole. The second via hole is exposed from the sacrificial dielectric layer. The method also includes etching the sacrificial dielectric layer in the first via hole and the second dielectric layer until the first conductive feature and the second conductive feature become exposed through the first via hole and the second via hole, respectively. The method further includes forming a third conductive feature in the first via hole and a fourth conductive feature in the second via hole. The third width of the third conductive feature is less than the first width and the fourth width of the fourth conductive feature.

In accordance with some embodiments, a method for forming a semiconductor device structure is provided. The method includes forming a first conductive feature in a first dielectric layer. The method also includes forming a second dielectric layer over the first dielectric layer. The method further includes etching the second dielectric layer to form a first via hole. In addition, the method includes depositing a sacrificial dielectric layer over the second dielectric layer so that the first via hole becomes narrower. The method also includes etching the sacrificial dielectric layer and the second dielectric layer until the first via hole extends to expose the first conductive feature in the first dielectric layer. The method further includes filling the first via hole with a conductive material to form a second conductive feature in the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a dielectric layer over a first conductive feature and a second conductive feature, wherein the dielectric layer comprises a first via hole and a second via hole;
   depositing a conformal layer in the first via hole and the second via hole to cover the dielectric layer;
   removing the conformal layer in the second via hole to expose a bottom and sidewalls of the second via hole, wherein the dielectric layer remains covered by the conformal layer in the first via hole after the removal of the conformal layer in the second via hole;
   etching the conformal layer in the first via hole and the dielectric layer after the removal of the conformal layer in the second via hole, so that the first conductive feature and the second conductive feature become exposed through the first via hole and the second via hole, respectively; and
   forming a third conductive feature in the first via hole and a fourth conductive feature in the second via hole.

2. The method for forming a semiconductor device structure as claimed in claim 1, further comprising:
   forming a mask layer covering the conformal layer in the first via hole before the removal of the conformal layer in the second via hole, wherein the conformal layer in the second via hole is exposed from the mask layer; and
   removing the mask layer before the etching of the conformal layer in the first via hole and the dielectric layer.

3. The method for forming a semiconductor device structure as claimed in claim 1, wherein the dielectric layer is partially removed during the removal of the conformal layer in the second via hole so that the second via hole becomes deeper than the first via hole.

4. The method for forming a semiconductor device structure as claimed in claim 1, wherein an etching rate of the conformal layer is substantially equal to or less than an etching rate of the dielectric layer during the etching of the conformal layer in the first via hole and the dielectric layer.

5. The method for forming a semiconductor device structure as claimed in claim 1, further comprising:
   forming a first trench and a second trench in the dielectric layer during the etching of the conformal layer in the first via hole and the dielectric layer, wherein the first trench and the second trench are different sizes.

6. The method for forming a semiconductor device structure as claimed in claim 1, further comprising:
   forming a barrier layer over the first conductive feature and the second conductive feature, wherein the barrier layer is covered by the dielectric layer; and
   etching the barrier layer during the etching of the conformal layer in the first via hole and the dielectric layer until the first via hole and the second via hole extend to penetrate through the barrier layer,
   wherein the first via hole has a first width in the barrier layer and the second via hole has a second width in the barrier layer, and wherein the first width is less than the second width.

7. The method for forming a semiconductor device structure as claimed in claim 1, wherein the dielectric layer comprises a dielectric material, and the conformal layer comprises the dielectric material.

8. A method for forming a semiconductor device structure, comprising:
   forming a first conductive feature and a second conductive feature in a first dielectric layer, wherein a first width of the first conductive feature is less than a second width of the second conductive feature;
   forming a second dielectric layer over a top surface of the first dielectric layer;
   etching the second dielectric layer to form a first via hole and a second via hole;
   forming a sacrificial dielectric layer over the second dielectric layer, wherein the sacrificial dielectric layer is in the first via hole, and the second via hole has a bottom and sidewalls that are exposed from the sacrificial dielectric layer;
   etching the sacrificial dielectric layer in the first via hole and the second dielectric layer until the first conductive feature and the second conductive feature become exposed through the first via hole and the second via hole, respectively; and
   forming a third conductive feature in the first via hole and a fourth conductive feature in the second via hole, wherein a third width of the third conductive feature is less than the first width and a fourth width of the fourth conductive feature.

9. The method for forming a semiconductor device structure as claimed in claim 8, wherein the first width, the second width, the third width and the fourth width are measured along the top surface of the first dielectric layer, and wherein the fourth width is less than the second width and greater than the first width.

10. The method for forming a semiconductor device structure as claimed in claim 8, wherein the sacrificial dielectric layer has a thickness, and wherein a difference between the third width and the fourth width is substantially equal to about two times the thickness.

11. The method for forming a semiconductor device structure as claimed in claim 8, wherein the sacrificial dielectric layer extends in the first via hole without filling up the first via hole and the second via hole.

12. The method for forming a semiconductor device structure as claimed in claim 8, wherein the formation of the sacrificial dielectric layer further comprises:
    forming a mask layer covering the sacrificial dielectric layer in the first via hole, wherein the sacrificial dielectric layer in the second via hole is exposed from the mask layer;
    performing an etching process over the mask layer to remove the sacrificial dielectric layer in the second via hole so that the bottom and the sidewalls of the second via hole are exposed from the sacrificial dielectric layer, and the second dielectric layer is partially exposed from the sacrificial dielectric layer; and
    removing the mask layer to expose the sacrificial dielectric layer in the first via hole before the etching of the sacrificial dielectric layer in the first via hole and the second dielectric layer.

13. A method for forming a semiconductor device structure, comprising:
    forming a first conductive feature in a first dielectric layer;
    forming a second dielectric layer over the first dielectric layer;
    etching the second dielectric layer to form a first via hole and a second via hole;
    depositing a sacrificial dielectric layer over the second dielectric layer so that the first via hole and the second via hole become narrower;

partially removing the sacrificial dielectric layer to expose a bottom and sidewalls of the second via hole from the sacrificial dielectric layer;

removing the sacrificial dielectric layer and a portion of the second dielectric layer using an etching process after exposing the bottom and the sidewalls of the second via hole, so that the first via hole extends to expose the first conductive feature in the first dielectric layer and; and filling the first via hole with a conductive material to form a second conductive feature in the second dielectric layer.

14. The method for forming a semiconductor device structure as claimed in claim 13, wherein the deposition of the sacrificial dielectric layer comprises performing an atomic layer deposition process over the second dielectric layer and in the first via hole.

15. The method for forming a semiconductor device structure as claimed in claim 13, further comprising:

forming a third conductive feature in the first dielectric layer, wherein the second via hole extends to expose the third conductive feature in the first dielectric layer during the removal of the sacrificial dielectric layer and the portion of the second dielectric layer; and filling the second via hole with the conductive material to form a fourth conductive feature in the second dielectric layer, wherein the first conductive feature is narrower than the third conductive feature and fourth conductive feature and is wider than the second conductive feature.

16. The method for forming a semiconductor device structure as claimed in claim 15, wherein the first via hole becomes narrower than the second via hole after the partial removal of the sacrificial dielectric layer and before the removal of the sacrificial dielectric layer and the portion of the second dielectric layer.

17. The method for forming a semiconductor device structure as claimed in claim 15, wherein the second via hole becomes wider and deeper during the partial removal of the sacrificial dielectric layer.

18. The method for forming a semiconductor device structure as claimed in claim 15, further comprising:

forming a barrier layer covering the first conductive feature and the third conductive feature, wherein the barrier layer is between the first dielectric layer and the second dielectric layer; and etching the barrier layer during the removal of the sacrificial dielectric layer and the portion of the second dielectric layer until the first via hole and the second via hole penetrate through the barrier layer, wherein the first via hole has a first width in the barrier layer and the second via hole has a second width in the barrier layer, and wherein the first width is less than the second width.

19. The method for forming a semiconductor device structure as claimed in claim 13, further comprising:

forming an anti-reflective layer over the second dielectric layer;

forming a hard mask layer over the second dielectric layer; and patterning the hard mask layer and the anti-reflective layer before forming the first via hole and the second via hole, wherein the sacrificial dielectric layer covers and adjoins the hard mask layer, the anti-reflective layer and the second dielectric layer.

20. The method for forming a semiconductor device structure as claimed in claim 13, further comprising:

forming a first trench and a second trench in the second dielectric layer during the removal of the sacrificial dielectric layer and the portion of the second dielectric layer, wherein the second trench is deeper than the first trench and is shallower than the first via hole.

* * * * *